US009960310B1

(12) United States Patent
Voss et al.

(10) Patent No.: US 9,960,310 B1
(45) Date of Patent: May 1, 2018

(54) RAPID PULSE ANNEALING OF CDZNTE DETECTORS FOR REDUCING ELECTRONIC NOISE

(71) Applicant: Lawrence Livermore National Security, LLC, Livermore, CA (US)

(72) Inventors: Lars Voss, Livermore, CA (US); Adam Conway, Livermore, CA (US); Art Nelson, Livermore, CA (US); Rebecca J. Nikolic, Oakland, CA (US); Stephen A. Payne, Castro Valley, CA (US); Erik Lars Swanberg, Jr., Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days. days.

(21) Appl. No.: 15/343,081

(22) Filed: Nov. 3, 2016

(51) Int. Cl.
*H01L 31/115* (2006.01)
*G01T 1/24* (2006.01)
(Continued)

(52) U.S. Cl.
CPC .............. *H01L 31/115* (2013.01); *G01T 1/24* (2013.01); *H01L 31/02161* (2013.01);
(Continued)

(58) Field of Classification Search
CPC .............. H01L 31/115; H01L 31/1864; H01L 31/02161; H01L 31/02966; H01L 31/022408; H01L 31/1832; G01T 1/24
(Continued)

(56) References Cited

U.S. PATENT DOCUMENTS 5,151,135 A * 9/1992 Magee ................. B08B 7/0042
117/97
8,778,724 B2 * 7/2014 Blue .................... H01L 31/0296
438/85
(Continued)

OTHER PUBLICATIONS

Voss et al., "Advanced Structures for Next Generation CdZnTe Gamma Detectors," Apr. 4, 2015, pp. 1-27.
(Continued)

*Primary Examiner* — Fernando L Toledo
*Assistant Examiner* — Adam S Bowen
(74) *Attorney, Agent, or Firm* — Zilka-Kotab, PC

(57) ABSTRACT

A combination of doping, rapid pulsed optical and/or thermal annealing, and unique detector structure reduces or eliminates sources of electronic noise in a CdZnTe (CZT) detector. According to several embodiments, methods of forming a detector exhibiting minimal electronic noise include: pulse-annealing at least one surface of a detector comprising CZT for one or more pulses, each pulse having a duration of ~0.1 seconds or less. The at least one surface may optionally be ion-implanted. In another embodiment, a CZT detector includes a detector surface with two or more electrodes operating at different electric potentials and coupled to the detector surface; and one or more ion-implanted CZT surfaces on or in the detector surface, each of the one or more ion-implanted CZT surfaces being independently connected to one of the two or more electrodes and the surface of the detector. At least two of the ion-implanted surfaces are in electrical contact.

22 Claims, 10 Drawing Sheets

900

Pulse-anneal at least one surface of a detector comprising ion-implanted CdZnTe for one or more pulses, each pulse being characterized by a duration of approximately 0.1 seconds or less — 902

(51) Int. Cl.
   *H01L 31/18*    (2006.01)
   *H01L 31/0296*  (2006.01)
   *H01L 31/0224*  (2006.01)
   *H01L 31/0216*  (2014.01)
(52) U.S. Cl.
   CPC ............. *H01L 31/02966* (2013.01); *H01L 31/022408* (2013.01); *H01L 31/1832* (2013.01); *H01L 31/1864* (2013.01)
(58) Field of Classification Search
   USPC ....................................................... 257/428
   See application file for complete search history.

(56) References Cited

U.S. PATENT DOCUMENTS

| | | | | |
|---|---|---|---|---|
| 2011/0147599 | A1* | 6/2011 | Grobshtein | G01T 1/1647 250/370.09 |
| 2012/0156827 | A1* | 6/2012 | Michael | H01L 21/428 438/95 |
| 2013/0065355 | A1* | 3/2013 | Liang | H01L 31/0749 438/95 |
| 2013/0217211 | A1* | 8/2013 | Chawla | H01L 21/02557 438/478 |

OTHER PUBLICATIONS

Duff et al., "Effect of surface preparation technique on the radiation detector performance of CdZnTe," Applied Surface Science, vol. 254, 2008, pp. 2889-2892.

Wang et al., "Analysis of In and Al doped high resistivity CdZnTe crystal," Phys. Status Solidi C, vol. 7, No. 6, 2010, pp. 1498-1500.

Nemirovsky et al.,"Characterization of Dark Noise in CdZnTe Spectrometers Journal of Electronic Materials," vol. 27, No. 6, 1998, pp. 807-812.

Stoltz et al., "Comparing ICP and ECR Etching of HgCdTe, CdZnTe, and CdTe," Journal of Electronic Materials, vol. 36, No. 8, 2007, pp. 1007-1012.

Narita et al., "Development of Prototype Pixellated PIN CdZnTe Detectors," SPIE Conference on Hard X-Ray and Gamma-Ray Detector Physics and Applications, vol. 3446, Jul. 1998, pp. 218-227.

Bassani et al., "Donor doping of (211) CdTe epilayers and CdTe/CdZnTe piexoelectric heterostructures by molecular beam epitaxy," Applied Physics Letters, vol. 63, No. 15, 1993, pp. 2106-2108.

Noda et al., "Growth of CdZnTe and CdSeTe crystals for p-i-n radiation detectors," Journal of Crystal Growth, vol. 214, No. 215, 2000, pp. 1121-1124.

Tatarenko et al., "Nitrogen doping of Te-based II-VI compounds," Journal of Crystal Growth, vol. 175, No. 176, 1997, pp. 682-687.

Stoltz et al., "Plasma Passivation Etching for HgCdTe," Journal of Electronic Materials, vol. 38, No. 8, 2009, pp. 1741-1745.

Voss et al., "Surface current reduction in (211) oriented Cd0.46Zn0.04Te0.50 crystals by Ar bombardment," Journal of Applied Physics, vol. 108, 2010, pp. 1-3.

International Search Report and Written Opinion from PCT Application No. PCT/US17/50800, dated Dec. 6, 2017.

* cited by examiner

RAPID PULSE ANNEALING OF CDZNTE DETECTORS FOR REDUCING ELECTRONIC NOISE

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to CdZnTe (CZT) detectors, and more particularly, this invention relates to fabrication techniques and corresponding structures for reducing electronic noise in CZT detectors by reducing bulk and surface leakage current.

BACKGROUND

High resolution, room temperature spectroscopy of gamma rays requires semiconductor gamma detectors such as CdZnTe or TlBr. In order to achieve the best performance, these detectors utilize advanced electrical contact and read-out schemes including pixilation, co-planar grids, and hemispherical contacts.

These schemes require an electric field both through the bulk of the device and often across a given surface. This results in electronic noise from leakage current, which can be defined as either bulk or surface leakage current. Electronic noise arises from current injected into a CdZnTe (CZT) detector that flows along the surface and/or through the bulk thereof; current generated by defects along the surface of the CZT, bursts of anomalous noise, and/or buildup of charge at non-Ohmic contacts.

The current state of the art for CdZnTe gamma detectors uses contacts deposited on an as-polished surface, such as the detector 100 shown in FIG. 1. The detector 100 includes a bulk portion 102 composed of a suitable detector material for the particular target to be detected (e.g. cadmium-zinc-tellurium (CdZnTe, or CZT) for detecting gamma radiation). The bulk portion 102 has formed on a surface thereof metal contacts 104, comprising a material suitable for use as an electrode, e.g. gold or aluminum (which act as Ohmic or Schottky contacts), and the contacts 104 may optionally be formed on doped portions 106, 108 of the surface of the bulk portion 102. Ohmic contacts typically display higher leakage current while Schottky contacts may display charge buildup at the interface, distorting the electric field. The optional doped portions 106, 108, which are notably excluded from most conventional CZT detector structures, may be doped with a suitable dopant species such as aluminum or phosphorous. Alternatively, a layer of amorphous silicon or selenium (not shown) may be formed in place of the doped portions 106, 108, and may extend across the entire width of the structure as shown in FIG. 1.

Notably, the doped portions 106, 108 are not in physical contact, nor are they electrically coupled/contacting. A doped layer 110 is formed, again optionally, on a surface of the bulk portion 102 opposite the surface onto which contacts 104 are formed; and a final Ohmic contact layer 112 is formed on a surface of the doped layer 110 opposite the bulk portion 102. One or more surfaces of the bulk portion 102 and/or doped portions/layer 106, 108, 110 may be treated via etching and oxidation to generate passivating layers 114 on surface(s) of the corresponding portions, as shown in FIG. 1.

Conventional detector configurations such as shown in FIG. 1 can achieve low leakage current but still suffer from injected current at the contacts which acts as a source of electronic noise. In addition to the leakage current, anomalous bursting noise is commonly observed at high biasing fields. Finally, buildup of charge at non-Ohmic contacts can distort the applied electric field. Because of this, detectors are operated at lower fields than may be optimal.

Accordingly, it would be useful to provide systems and techniques that minimize or eliminate injected current and defect generated noise, enabling operation of detectors at higher field strengths to improve signal collection ability.

SUMMARY

According to one embodiment, a method of forming a detector exhibiting minimal electronic noise includes: pulse-annealing at least one surface of a detector comprising CdZnTe (CZT) for one or more pulses, each pulse being characterized by a duration of approximately 0.1 seconds or less.

According to another embodiment, a method of forming a detector exhibiting minimal electronic noise includes: pulse-annealing at least one surface of a detector comprising ion-implanted CdZnTe (CZT) for one or more pulses, each pulse being characterized by a duration of approximately 0.1 seconds or less.

According to yet another embodiment, a CdZnTe (CZT) detector includes a detector surface with two or more electrodes operating at different electric potentials and coupled to the detector surface.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of CdZnTe (CZT) detectors, and more particularly, this invention relates to fabrication techniques and corresponding structures for reducing electronic noise in CZT detectors by reducing bulk and surface leakage current and minimizing charge buildup at contacts.

Electronic noise as described herein generally refers to two sources: dark current and anomalous burst noise.

Figure 1:
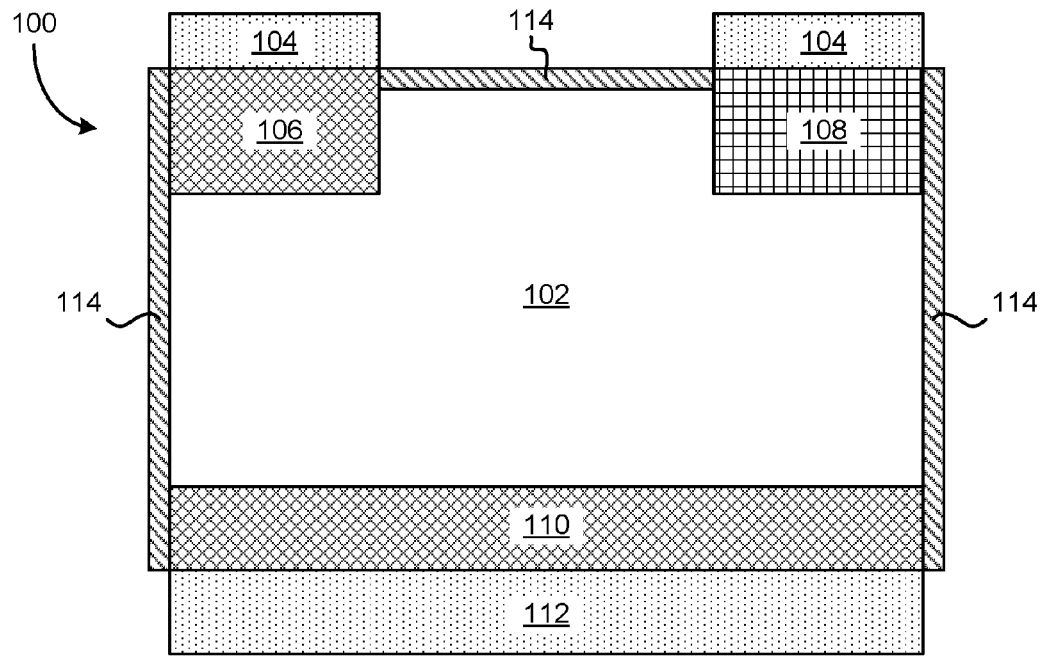
FIG. 1 is a simplified schematic of a conventional CZT detector structure, shown from a side view.

Dark current includes electrical current flowing through a photosensitive detector even in the absence of any photons entering the detector. Dark current may arise from random generation of electrons and holes in the detector structure. Sources of dark current of primary interest in the context of the present disclosure includes current that flows along the surface of the detector (i.e. horizontally between contacts 104 as shown in FIG. 1, also referred to as "surface current") and/or through its bulk (i.e. vertically through the bulk portion 102 as shown in FIG. 1, also referred to as "bulk current," exemplified by current traveling from contact 104 to contact 112, or vise-versa); as well as current generated by defects along the surface of the detector (although such defects are generally associated with anomalous burst noise). In addition, the use of non-Ohmic contacts at 104, and/or 112 may lead to build up of charge that distorts the applied electric field and degrades performance.

The inventors have found that novel fabrication techniques using a combination of ion implantation, pulsed optical and/or thermal annealing, and employing unique detector structures (e.g. utilizing P-I-N homojunctions as described in further detail below), can reduce noise within the detector, particularly noise generated by one or more of the foregoing mechanisms. Particularly, pulsed annealing and unique detector structures (such as shown in FIGS. 2A-2F and described in greater detail below) convey advantageous reductions in detector noise relative to conventional structures (e.g. as shown in FIG. 1) and techniques for fabrication thereof.

In particular, rapid, pulsed annealing with characteristic times of <100 ms is required in order to activate the dopants without damaging the bulk transport properties of the crystal. Annealing at temperatures >150° C. detrimentally affects the transport properties and thus the spectroscopic characteristics of the crystal. By using rapid pulses, the thermal load is minimized and only the near surface region is heated. Further, it has been shown that rapid, pulsed annealing of conventional detector structures without doping, an example of which is shown in FIG. 1, can decrease the electronic noise and improve their performance.

For instance, conventional structures such as shown in FIG. 1 exhibit significant bulk leakage current due to the presence of surface and interface defects and lack of junctions such as a P-I-N structure to minimize such sources of noise; in addition, the use of non-Ohmic contacts to reduce leakage current may result in charge buildup underneath the contacts 104.

Accordingly, the inventive concepts presented herein, in several embodiments, involve methods and corresponding structures that reduce dark current (including bulk and surface leakage current) by a factor of two or more, as well as the anomalous bursting noise in CZT detectors. In this manner, the electronic noise component, particularly of the gamma spectrum, is reduced for a given field and, if desirable, higher strength fields can be applied to the detector to improve signal collection. Without wishing to be bound to any particular theory, the inventors postulate the dark current reduction is a result of activation of intentional dopants to form p and n type regions and thus junctions, improved crystallinity and removal of defects from surfaces, and activation of intentional dopants between electrodes to pin the Fermi level near the middle of the band gap.

According to one general embodiment, a method of forming a detector exhibiting minimal electronic noise includes: pulse-annealing at least one surface of a detector comprising CdZnTe (CZT) for one or more pulses, each pulse being characterized by a duration of approximately 0.1 seconds or less.

According to another general embodiment, a method of forming a detector exhibiting minimal electronic noise includes: pulse-annealing at least one surface of a detector comprising ion-implanted CdZnTe (CZT) for one or more pulses, each pulse being characterized by a duration of approximately 0.1 seconds or less.

According to yet another general embodiment, a CdZnTe (CZT) detector includes a detector surface with two or more electrodes operating at different electric potentials and coupled to the detector surface.

FIGS. 2A-F represent simplified schematic side-views of various embodiments of a CZT detector in accordance with the presently disclosed inventive concepts.

Figure 2A:
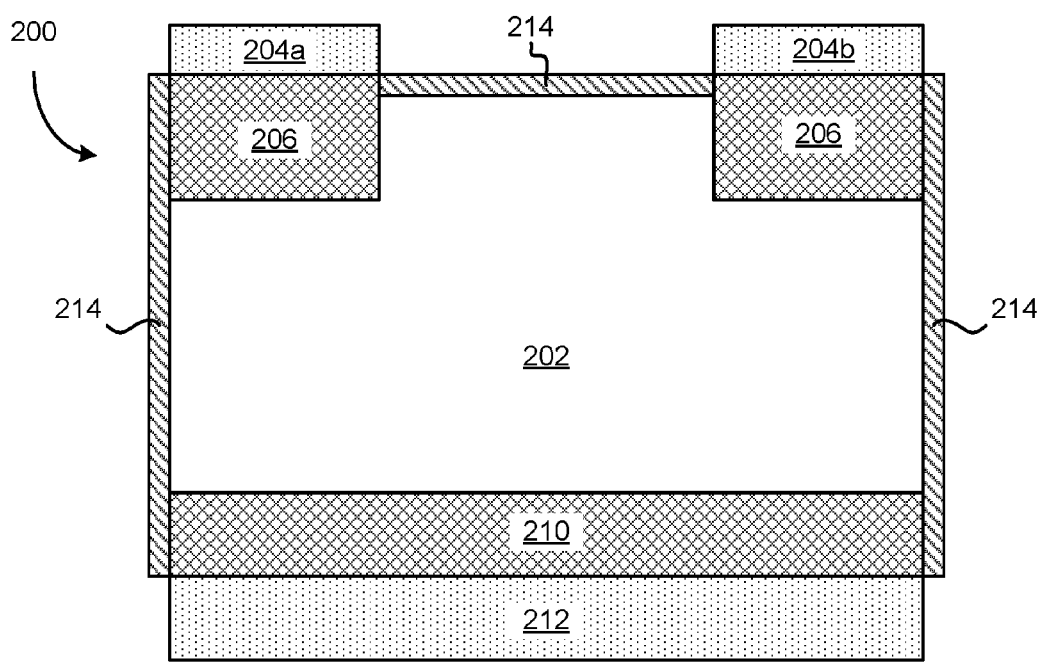
FIG. 2A is a simplified schematic side-view of an improved CZT detector structure exhibiting reduced electronic noise relative to the conventional CZT detector structure of FIG. 1, according to one embodiment of the presently disclosed inventive concepts.

Referring now to FIG. 2A, a detector 200 in accordance with a preferred embodiment of the presently disclosed inventive concepts may have a structure substantially identical to the conventional detector 100 shown in FIG. 1, but exhibits reduced electronic noise as a result of using pulse-annealing to form the dopant regions 206 and/or 210 with improved crystallinity and reduced incidence of defects on the surfaces of the detector 200. Data demonstrating the advantages conveyed by pulse annealing an undoped conventional detector structure such as shown in FIG. 1 (but lacking doped portions 106, 108 and 110, as is the case for most conventional CZT detectors) are presented in FIG. 4, and described further below.

The detector 200 includes a bulk portion 202 comprising, preferably consisting of, a suitable detector material for detecting target radiation including but not limited to gamma rays. For example, the bulk portion 202 may comprise an undoped, intrinsic semiconductor or a semiconductor with intentional dopants that pin the Fermi level in the mid gap in order to increase resistivity, in various approaches. According to one approach, bulk portion 202 comprises or consists of a CdZnTe composition. The respective mole fraction of the cadmium, zinc, and tellurium may be varied according to knowledge generally available in the art to optimize the detector 200 for detecting the target radiation without departing from the scope of the presently disclosed inventive concepts.

On opposite surfaces of the bulk portion 202 are formed contacts 204a, 204b, 212, with the contacts 204a, 204b, 212 preferably being formed in, on, or adjacent to doped regions 206 and 210, respectively (doped regions may be equivalently referred to as "ion-implanted surfaces" in accordance with the presently disclosed inventive concepts). In various embodiments in accordance with FIGS. 2A-2F, contacts 204a, 204b, and/or 212 (but especially 204a and 204b) may be in the form of a metal electrode, a pixel, a steering grid, a coplanar grid. Exemplary embodiments of these arrangements will be discussed in greater detail below regarding FIGS. 3A-3C. In the particular embodiment shown in FIG. 2A, where the detector 200 exhibits a bulk P-I-N configuration, the contacts 204a, 204b, and 212 are metal contacts, preferably Ohmic metal contacts.

In one approach in accordance with the embodiment shown in FIG. 2A, the upper (e.g. anode) surface of the detector is doped only with one (preferably p-type) species in both regions 206, while a different (preferably n-type) species is included in doped region 210 near the lower (e.g. cathode) surface. The dopants, according to preferred embodiments, are chosen to form a bulk P-I-N diode, however other diode types described herein may also be employed without departing from the scope of the present disclosure.

Figure 2B:
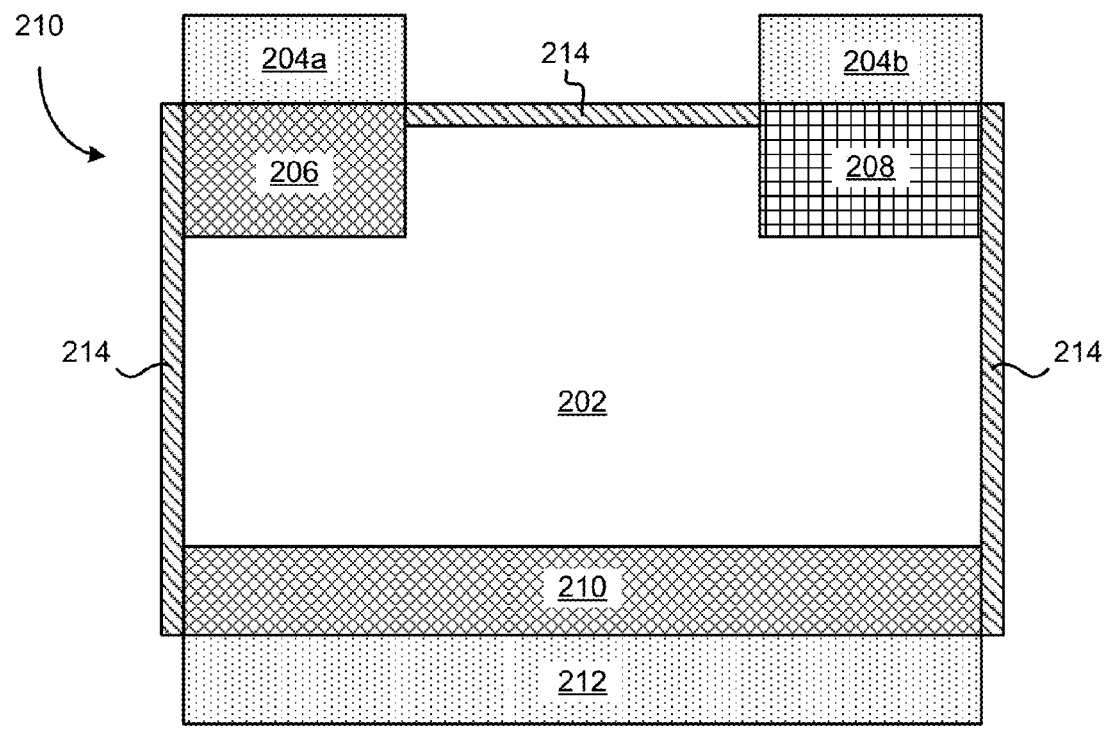
FIGS. 2B-2F depict simplified schematic side views of several additional exemplary embodiments of improved CZT detector structures exhibiting reduced electronic noise relative to the conventional CZT detector structure of FIG. 1.
Figure 2C:
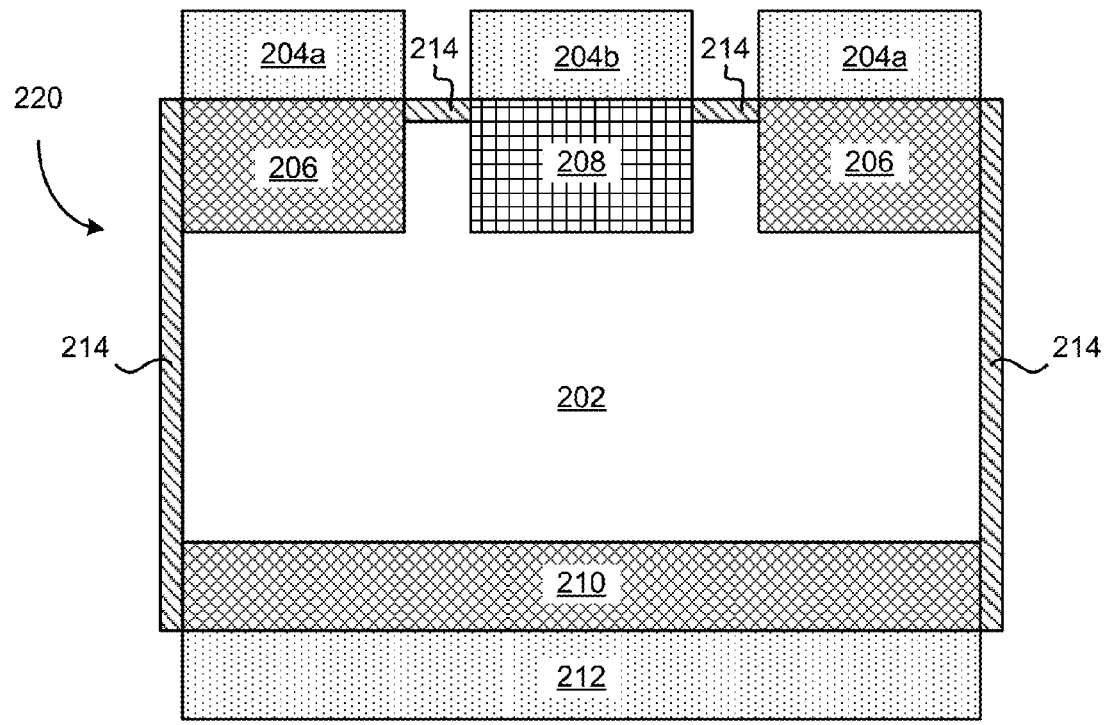
Figure 2D:
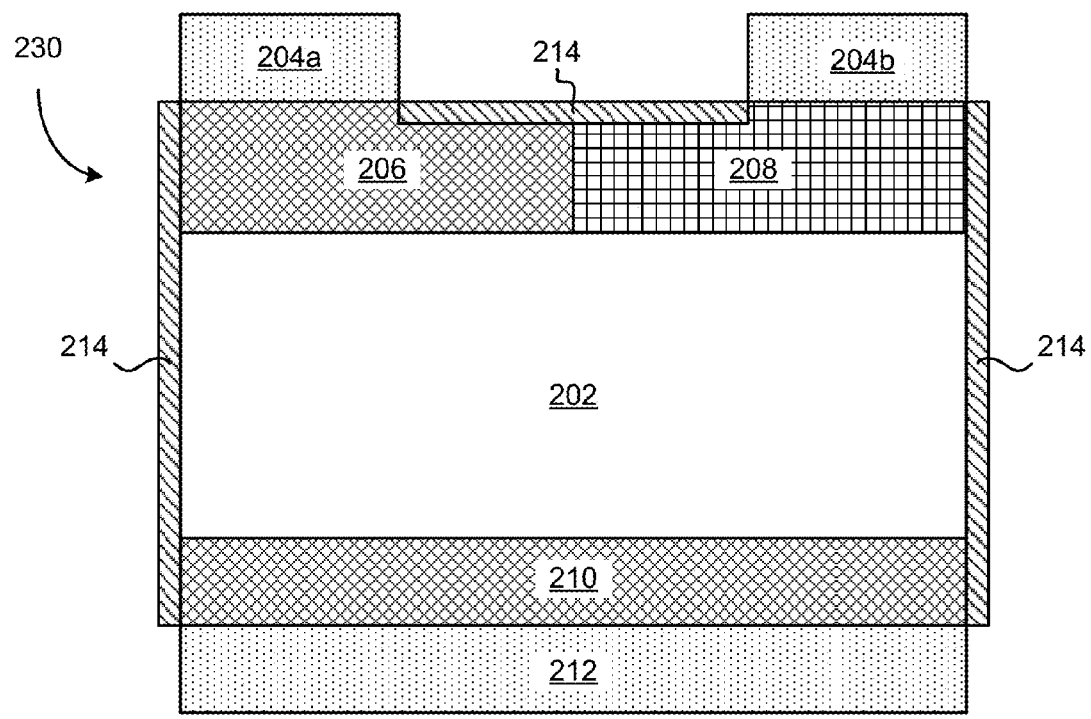

In other embodiments (e.g. as shown in FIGS. 2B-2D and 2F), regions 206 and 208 may be doped with different species to create a suitable surface diode, preferably a P-I-N diode, while the doped region 210 near the lower surface is doped with a suitable dopant species to create bulk diode(s) between the contacts. Preferably, the bulk diode(s) include a first bulk diode between one of the contacts 204a, 204b and contact 212, and a second diode between the other of contacts 204a, 204b and contact 212. Most preferably, the first bulk diode comprises a P-I-N diode while the second bulk diode comprises an N-I-N or a P-I-P diode. As shown in FIG. 2D, in some approaches the doped regions 206, 208 may be in electrical contact, causing the electrodes to stably operate at different potentials. Electrical contact does not necessarily require physical contact as depicted in FIG. 2D, but does require the doped regions extend to at least some extent into the region of the detector surface between contacts, preferably contact pairs.

In all cases, the area between contacts, including top and/or side surfaces of the detector, may preferably be passivated to reduce leakage current through the use of rapid pulse annealing, optionally with an additional dopant species selected to increase the resistivity of the material 202 either through reduced mobility or reduced carrier concentration. Passivation may be accomplished using etching and chemical oxidation, implantation of a particular dopant species, and/or rapid pulse annealing of the corresponding region, with pulse annealing being preferred. For instance, and with reference to FIGS. 2E and 2F, a damage region 216 may be created between contacts 204a, 204b, e.g. via ion implantation of the bulk portion 202 near the upper surface thereof.

Figure 2E:
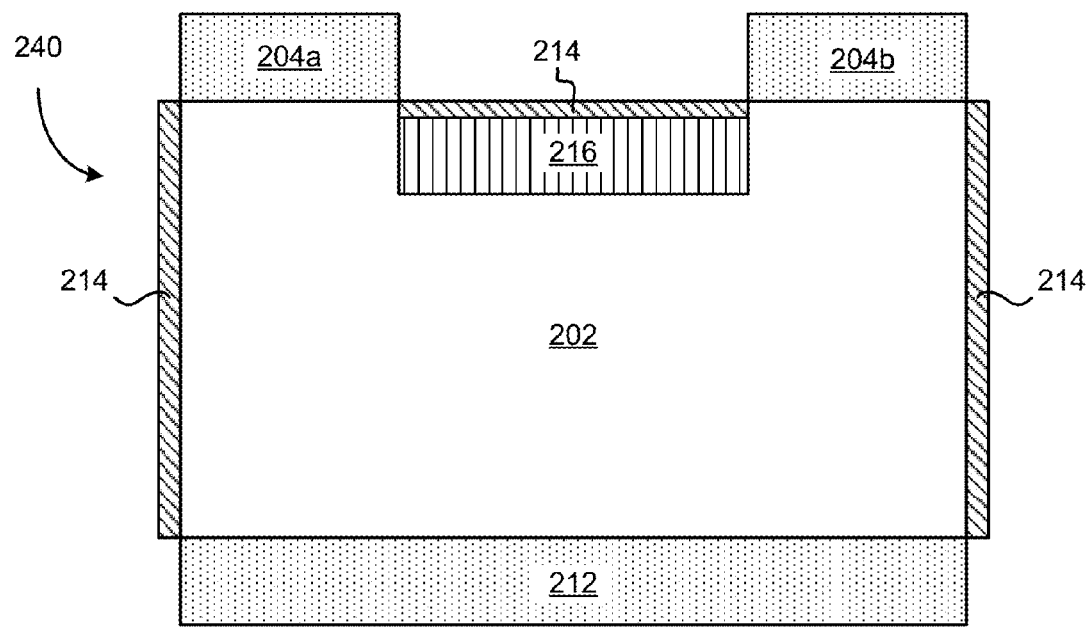
Figure 2F:
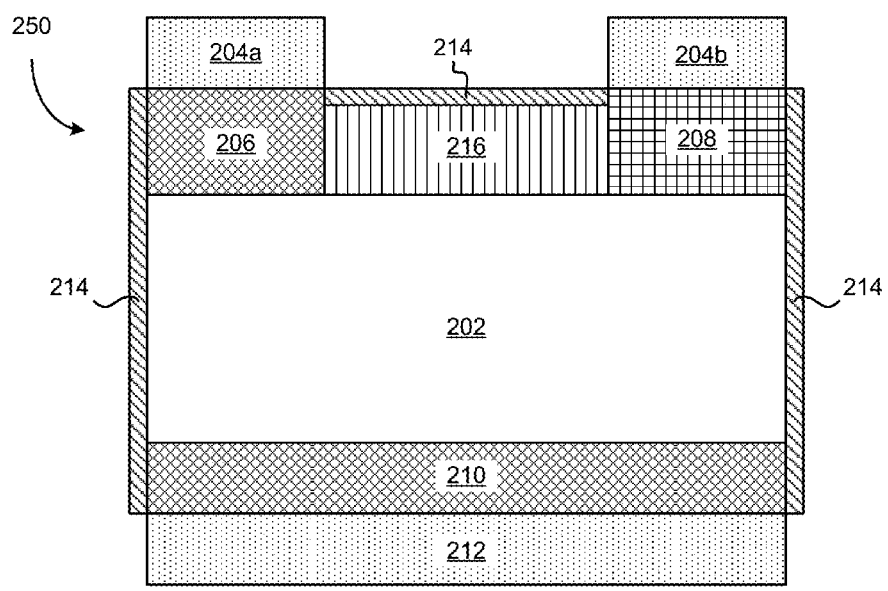

In some approaches (e.g. as shown in FIG. 2E), no dopant regions exist under the contacts and the only modification is to passivating layer 214, for instance pulsed annealing in the region where passivating layer 214 is formed, to reduce or eliminate surface defects. In other embodiments, additional dopant regions may be created in regions between the contacts, and the regions beneath the contacts may be doped as described hereinabove (e.g. additional dopant regions 216 according to the embodiment as shown in FIG. 2F). Preferably, the additional dopant regions comprise dopant(s) in the form of one or more ionic species of one or more materials selected from Group VII.

In additional embodiments, different metals may be used for the contacts 204a, 204b, and/or 212, e.g. in order to reduce leakage current, with metals selected depending on the dopant species and Ohmic contacts being preferred to reduce leakage current and reduce charge buildup under the contacts, which can adversely affect performance.

For example, for a contact coupled to a p-type region, a metal with a high work function (Au, Pt, Ni, etc.) would be preferred to form an Ohmic contact. For a contact coupled to an n-type region, a metal with a low work function (e.g. Al, In, etc.) would be preferred to form an Ohmic contact.

As noted above, contacts 204a, 204b, and/or 212 in various embodiments may be provided in the form of metal (preferably Ohmic) contacts, pixels, steering grids, coplanar grids, etc. in any combination. According to preferred embodiments of the respective structures shown in FIGS. 2A-2F, contacts 204a and 204b may each independently comprise or consist of: a metal Ohmic contact in the case of detector 200 (FIG. 2A); coplanar grids in the case of detectors 210, 230, and 250 (FIGS. 2B and 2D-2F, respectively); while in the case of detector 220 (FIG. 2C) contacts 204a each preferably comprise a pixel, while contacts 204b form a steering grid (this configuration is also shown from a top-down view in FIG. 3B). In more embodiments, particularly regarding detectors 210, 230, 240 and 250, contacts 204a and 204b may cooperatively define a coplanar grid (e.g. as shown from a top-down view in FIG. 3C).

In various approaches, the doped regions (particularly 206 and 208) may be in contact with each other (e.g. as shown in FIG. 2D) to create junctions such as PN or NP junctions. In more approaches the doped regions may be separated by a defined spacing to create a junction (e.g. as shown in FIGS. 2A, 2B, 2C, and 2F), preferably a P-I-N junction. The contacts may be positioned relative to the detector surface so as to be confined within a plane defined by the doped region. In other embodiments, dopants may be introduced into region(s) between the contacts in order to increase resistivity of this area (e.g. as shown in FIGS. 2E and 2F).

Accordingly, in various embodiments such as shown in FIGS. 2A-2F, the doped regions 206, 208, 210 are each independently doped with one or more appropriate dopants, such as one or more species of material(s) selected from Group III (e.g. B, Al, Ga, In), Group V (e.g. N, P, As, Sb), or Group VII (e.g. F, Cl, Br, I). Dopants may be introduced using any known technique, but preferably are incorporated using ion implantation.

Preferably, the dopants employed in the regions 206, 208, 210 are chosen so as to create a diode structure such as an N-P-N, a P-N-P, an N-I-N, a P-I-N, a P-I-P, or a PN type diode, with P-I-N structures being particularly preferred. Most preferably, the detector 200 includes both surface and bulk diodes, e.g. a surface P-I-N diode between an n-doped region 206 and a p-doped region 208, and a bulk P-I-N diode between n-doped region 206 and p-doped region 210.

Again with reference to FIGS. 2A-2F, and preferred embodiments of the corresponding structures, the dopant regions may be doped so as to create particular functional structures as follows. In accordance with detector 200 of FIG. 2A, preferably doped regions 206 comprise n-type dopants, while doped region 210 comprises a p-type dopant.

For certain embodiments of detector 210 as shown in FIG. 2B, preferably the doped region 206 comprises an n-type dopant, while doped regions 208, 210 each independently comprise a p-type dopant (which may be the same or different in each respective region). This configuration results in bulk and surface P-I-N diodes between the contacts and is particularly advantageous where at least some of the contacts are a coplanar grid arrangement.

In accordance with preferred embodiments of detector 220 as shown in FIG. 2C, doped regions 206 preferably comprise an n-type dopant, while doped regions 208 and 210 preferably comprise p-type dopants. This configuration is particularly advantageous in embodiments where the detector structure includes pixels surrounded by a steering grid, e.g. according to the top-down view of FIG. 3B.

In preferred variants of detector 230 as shown in FIG. 2D, doped region 206 preferably comprises an n-type dopant, while doped regions 208, 210 preferably comprise p-type dopants. This results in bulk and surface P-I-N diodes between the contacts, and is particularly advantageous where at least some of the contacts comprise coplanar grids.

Figure 7A:
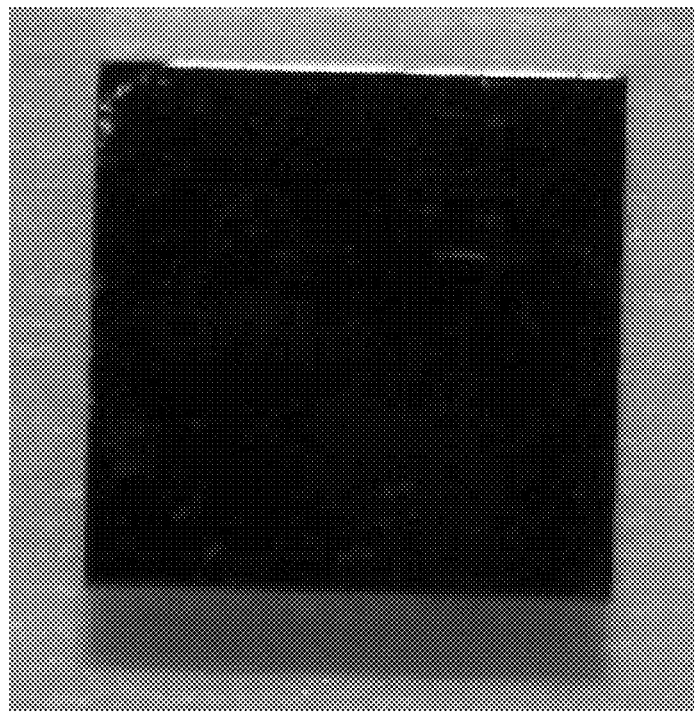
FIGS. 7A and 7B shows images of a CZT surface exposed to laser fluence below and above the damage threshold, respectively, according to one embodiment.
Figure 7B:
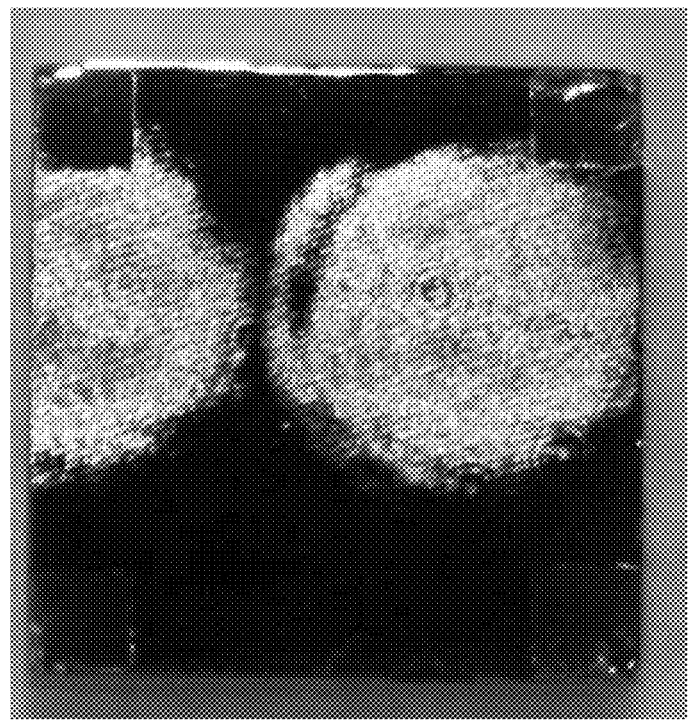

Now with reference to preferred embodiments of detector 240 as shown in FIG. 2E, the damage region 216 may comprise ion-implanted CZT (e.g. an "i-type" dopant) with the dopant species being chosen so as to provide higher resistivity within the damage region 216. Additionally and/or alternatively, damage region 216 may be formed via exposing surface(s) of the detector 240 to rapid, pulse annealing in an amount greater than a damage threshold of the material (e.g. as shown in FIG. 7B).

Regarding detector 250 as shown in FIG. 2F, the doped regions 206, 208 and 210 preferably follow the same scheme as set forth above regarding detector 210 shown in FIG. 2B.

Figure 3A:
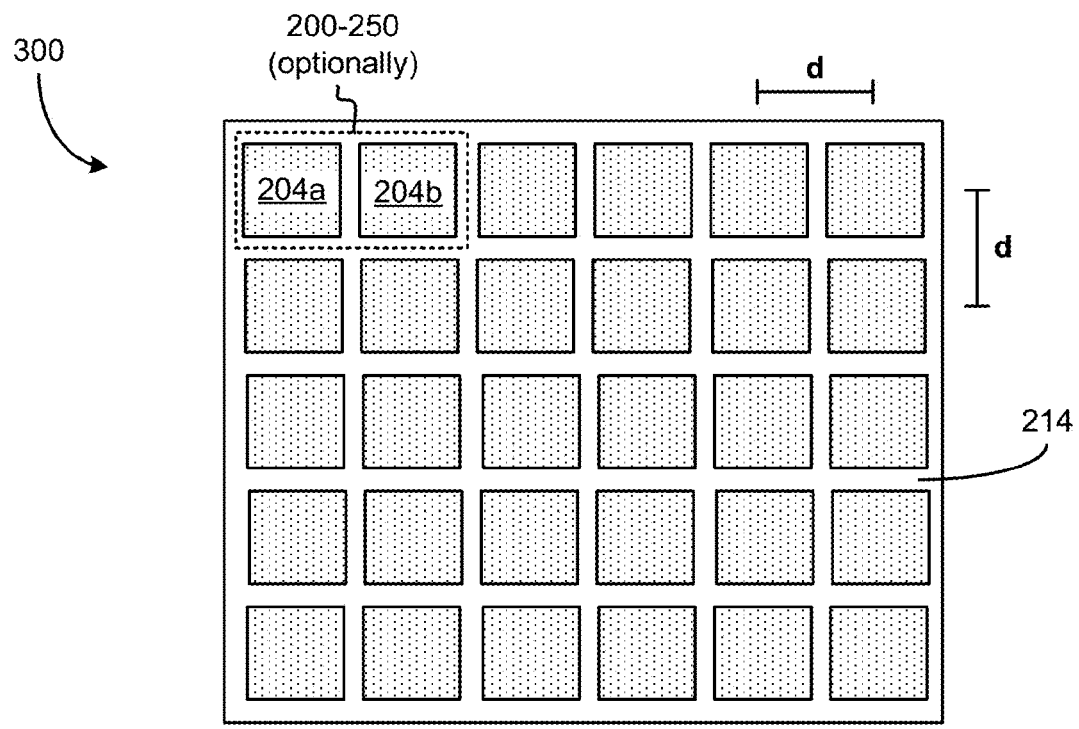
FIG. 3A is a simplified schematic top-down view of a pixelated CZT detector, according to one embodiment of the presently disclosed inventive concepts.
Figure 3B:
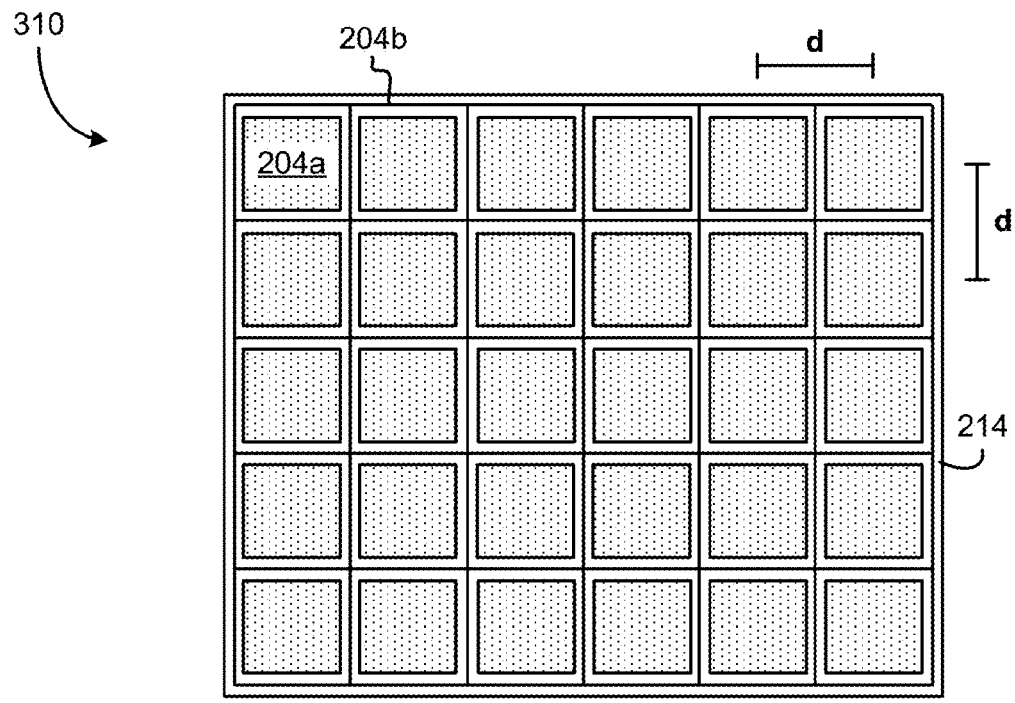
FIG. 3B is a simplified schematic top-down view of a pixelated CZT detector including a steering grid, according to one embodiment of the presently disclosed inventive concepts.
Figure 3C:
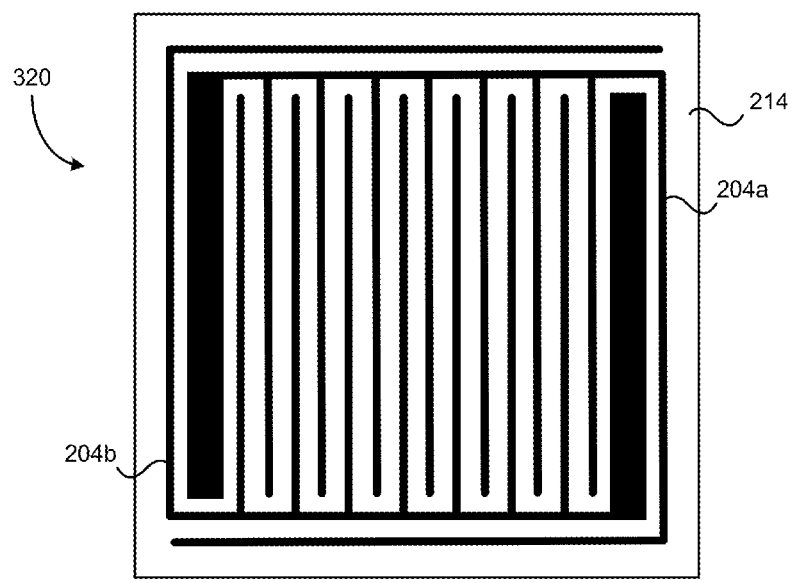
FIG. 3C is a simplified schematic top-down view of a coplanar grid CZT detector, according to one embodiment of the presently disclosed inventive concepts.

Accordingly, the contacts 204a, 204b on, in or adjacent to regions 206, 208 operate at different electric potentials, and are preferably electrically coupled (whether or not regions 206, 208 are in physical contact, as shown according to the embodiment of FIG. 2D). In some embodiments, contacts 204a, 204b may be considered individual "grids" of a detector 200. In more embodiments, a detector may include a plurality of pixels, pixels with steering grid, or a co-planar grid, such as shown in FIGS. 3A-3C, described in further detail below.

Figure 4:
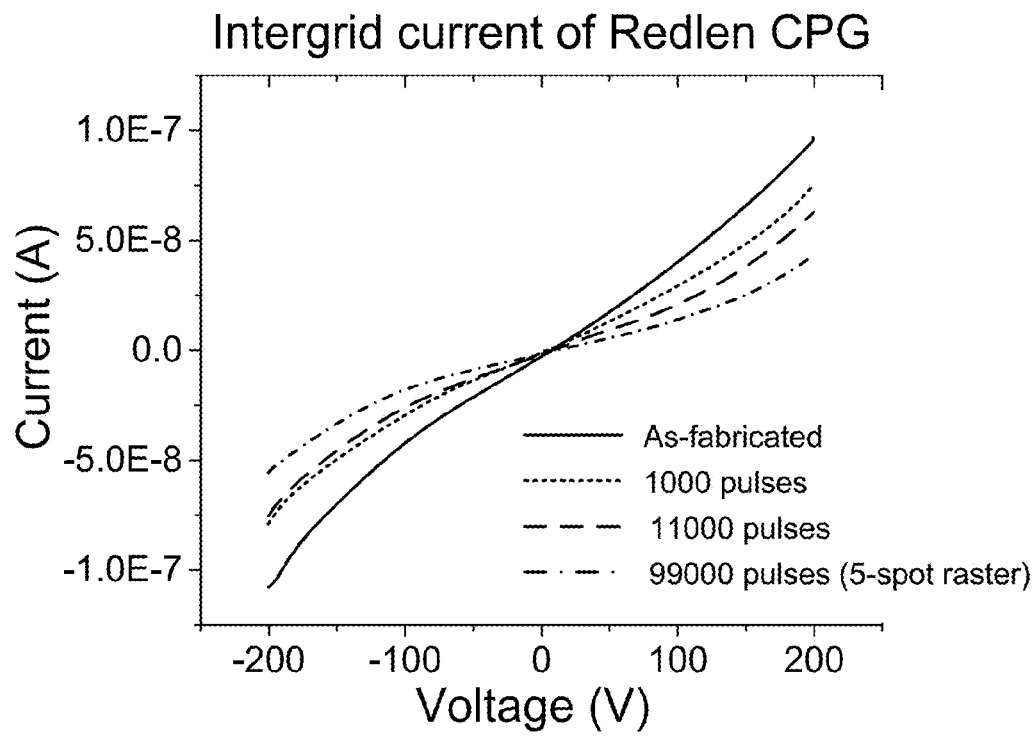
FIG. 4 is a chart depicting reduced surface leakage current of a conventional CZT detector after pulsed flash lamp annealing, According to one embodiment.

Critically, during formation of the detector 200, doped regions 206, 208 and/or 210 (preferably all doped regions) are subjected to heating in the form of rapid, pulsed annealing in order to incorporate the doping species into the lattice of the CdZnTe and to repair any damage resulting from ion implantation. It has also been observed that the use of rapid, pulsed annealing on conventional detectors, such as shown in FIG. 1, can also be used to reduce electronic noise. FIG. 4 shows reduced leakage current of a conventional, undoped detector before and after sequentially greater rapid, pulse annealing. This is postulated to be due to removal of surface and interfacial defects, annealing of the contacts, and modification of the crystal structure. In various embodiments, rapid pulse annealing may be performed in accordance with methods 800 and/or 900, as described in further detail below, to accomplish the aforementioned advantageous reductions in electronic noise.

Finally, according to any of the embodiments shown in FIGS. 2A-2F, side and top surfaces of the detector 200 may be functionalized by plasma etching and chemical oxidation, preferably after forming contacts 204a, 204b on the top surface of the detector, to form passivating layers or films 214 on the top and side surfaces of the detector. Preferably, the passivating layers or films 214 are formed on portions/surfaces of the detector adjacent and/or including the doped regions 206, 208. On the top surface of the detector, a first passivating layer or film 214 may be formed between the contacts 204a, 204b, while additional passivating layers or films 214 may be formed on side surfaces of the detector in or adjacent to the doped regions 206, 208, 210 and/or bulk portion 202.

It will be understood by skilled artisans reading the present descriptions that the various features set forth above individually with respect to FIGS. 2A-2F and the corresponding embodiments depicted therein may be combined in any suitable manner without departing from the scope of the present disclosures. Accordingly, any combination of junction types, configurations, etc. e.g. as conveyed by composition of the doped regions, may be employed. Similarly, different contact arrangements (described in further detail below regarding FIGS. 3A-3C) may be employed in various combinations without departing from the scope of the instant description. Passivation layers may be present on various surfaces of the detector, and various regions thereof in any combination as set forth herein.

The inventive structure of detectors such as shown in FIGS. 2A-2F advantageously minimize surface leakage current through a combination of the doping profile of doped regions 206, 208, 210, as well as the formation of passivation layers or films 214. Moreover, bulk leakage current is reduced via the side passivation layers or films 214 and may be further reduced in embodiments where the doped regions 206, 208, 210 form a homojunction such as a P-I-N structure. Further still, since surface defects (associated with damage typically present in the absence of treatment including plasma etching and chemical oxidation to form passivating layers as described herein) are associated with generation of anomalous burst noise, detectors such as shown in FIGS. 2A-2F advantageously exhibit reduced burst noise.

All of the foregoing advantages serve, particularly in combination, to significantly reduce the amount of noise generated by the detector, reducing false positive events and enabling improved signal detection, e.g. via the use of higher magnitude electric fields within the detector. Moreover still, investigators may have greater confidence in the magnitude of detector response being due to presence of target radiation rather than noise generated by the detector, and may derive more accurate information regarding the amount of radiation present in the detection environment.

Of course, in various embodiments different detector element configurations, may be employed.

For example, a pixelated CZT detector structure 300 is shown from a top-down view in FIG. 3A, according to one embodiment. The pixelated detector 300 includes a plurality of contacts (e.g. 204a, 204b), preferably pixels, each coupled to an upper surface of the detector. The upper surface of the detector preferably comprises a passivating layer 214, which may be formed via pulse annealing of at least the regions of the upper surface positioned between pixels. Although not shown in FIG. 3A, each pixel is preferably positioned above a doped region, e.g. doped region 206 and/or 208 depending on the detector structure employed. Moreover, pixels are preferably characterized by an inter-pixel distance d (also referred to as a contact pitch) between the center of individual pixels, which may be approximately 1.75 mm in one embodiment, and generally falls within a range from approximately 100 µm to approximately 5 mm.

Preferably, such structures are characterized by including contacts (e.g. 204a, 204b) which operate at different electric potentials. In various embodiments, any number of contacts included in complex detector arrangements may operate at the same, or at different potentials, without departing from the scope of the presently disclosed inventive concepts.

For instance, in one approach a plurality of contact pairs (again, e.g. 204a, 204b) may be incorporated into the detector structure, where each contact pair includes a first contact (e.g. 204a) operating at a first electric potential and a second contact (e.g. 204b) operating at a second electric potential. In more approaches, different contact pairs may operate at different electric potentials, e.g. a first contact pair having a first contact operating at a first electric potential and a second contact operating at a second electric potential, while a second contact pair includes a third contact operating at a third electric potential and a fourth contact operating at a fourth electric potential.

Contact pairs, according to some embodiments, may "overlap" such that one contact may be shared between two or more contact pairs (e.g. a central contact may be a member of four contact pairs, each including one of the vertically or horizontally adjacent contacts of a grid-like structure such). In other more complex embodiments, contact "groups" may include any number or arrangement of contacts such as lines, square/rectangular blocks, etc. as would be understood by persons having ordinary skill in the art upon reading the present descriptions. According to these more complex arrangements, any number of contacts may be shared among overlapping contact groups.

Turning now to FIG. 3B, a detector structure 310 is shown according to one embodiment. The detector structure 310 is also a pixelated detector, but distinct from the embodiment shown in FIG. 3A the detector structure 310 includes a steering grid positioned between pixels 204a, the steering grid being formed of a different contact material 204b and portions of the steering grid being positioned above dopant regions 208, e.g. as shown in FIG. 2C. Regions not located beneath pixels 204a and grid 204b preferably comprise a passivating layer 214 (again as shown in FIG. 2C).

In still more embodiments, a detector may be configured as a coplanar grid 320 such as shown in FIG. 3C. The coplanar grid comprises contacts 204a and 204b arranged in a complementary grid configuration and separated by passivating layer regions 214 between the contacts 204a and 204b. Although not shown in FIG. 3C, preferably the contact 204a is positioned above a doped region 206 of the detector, while the contact 204b is positioned above a doped region 208 of the detector, such that the respective doped regions are positioned under the contacts but do not necessarily extend into the regions therebetween (i.e. regions below the passivating layer 214 as shown in FIG. 3C). See, for example, the side-views shown in FIGS. 2B and 2D, respectively.

As mentioned briefly above, FIG. 4 shows reduced leakage current of a conventional detector before and after sequentially greater rapid, pulse annealing. Notably, with increasing amounts of annealing, the amount of intergrid current flowing through a coplanar grid arrangement is reduced as a function of field strength. Accordingly, treating detector surfaces via rapid pulse annealing is associated with reduced current at a given voltage, allowing operation of the detector at higher field strength and improving the signal detection capability of the detector.

Figure 5:
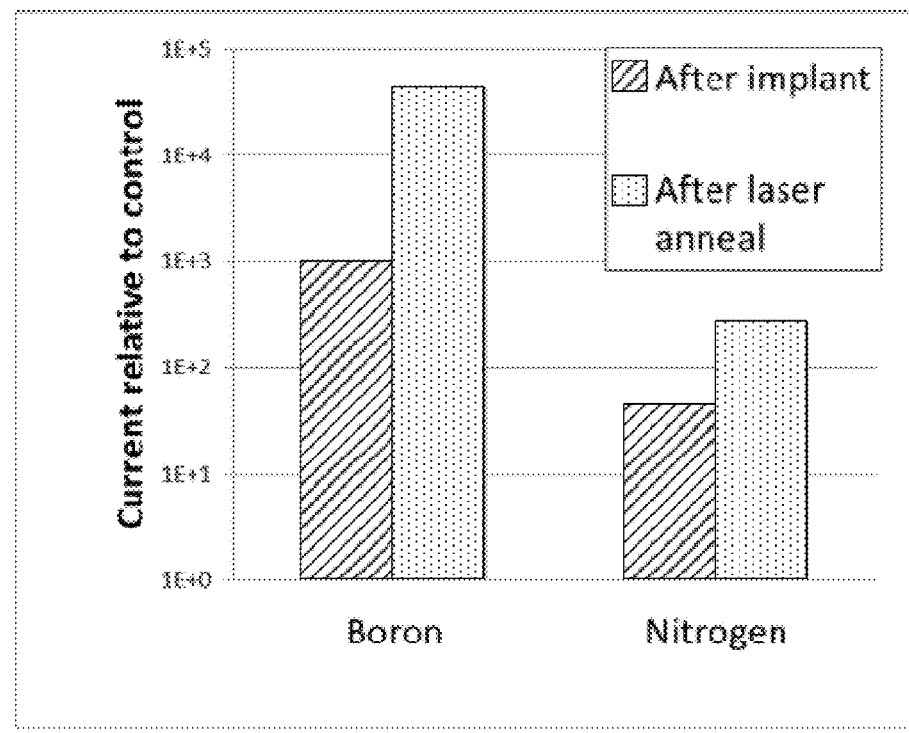
FIG. 5 is a chart showing activation of B and N dopants in CZT after implantation and laser annealing

FIG. 5 is a chart depicting amount of current at a given voltage for a detector structure after implantation, both before and after laser annealing. The data represented in FIG. 5 will be discussed further below, but generally note the amount of current after laser annealing increases, corresponding to a desirable increase in conductivity after doping, and further increase after laser annealing. Notably, this is indicative of increased activation of B and N dopants.

Figure 6A:
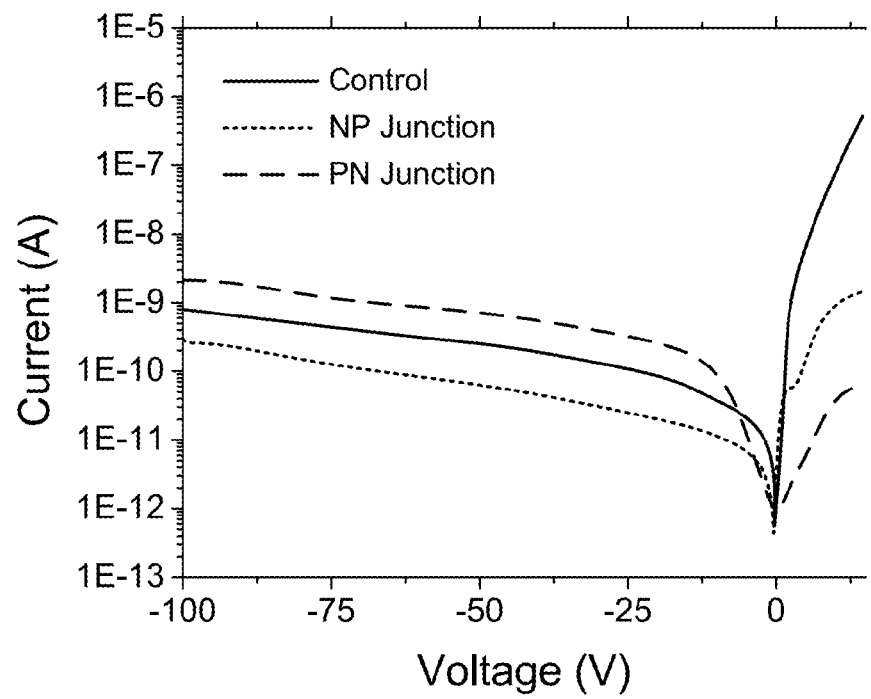
FIGS. 6A and 6B are charts depicting impact of presence of a doped junction in a CZT detector structure on detector current and voltage both on the surface and through the bulk, according to one embodiment of the presently disclosed inventive concepts.
Figure 6B:
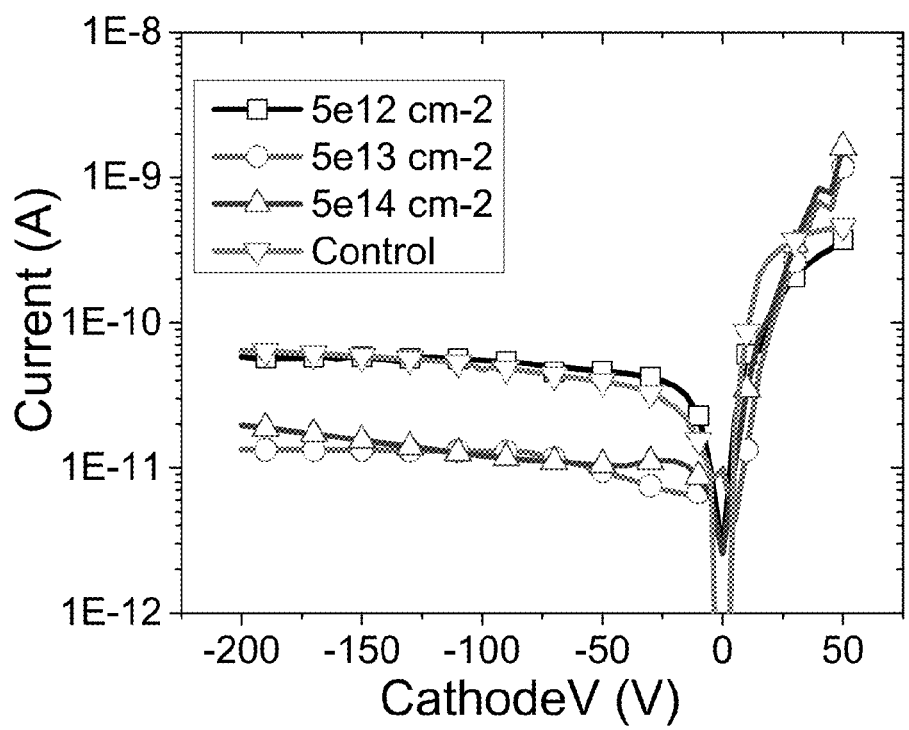

FIGS. 6A and 6B are charts depicting impact of presence of a doped junction (particularly an N—P—N type) on the resulting surface and bulk detector current and voltage respectively, according to one embodiment of the presently disclosed inventive concepts. Importantly, the junction is preferably formed via ion implantation followed by rapid, pulsed thermal annealing.

As noted above, the inclusion of doped junction structures within detectors in accordance with the presently disclosed inventive concepts advantageously contributes to reduction of noise originating from the detector and not associated with a photon interacting with the detector.

The presently disclosed inventive concepts include the notion that rapid, pulsed annealing is required to activate the implanted dopants without heating the bulk of the detector, which can result in degraded performance. In addition, it includes the concept that this rapid, pulsed annealing can also reduce electronic noise when performed on unimplanted, conventional detectors such as shown in FIG. 1. For example, see data shown in FIG. 4. Accordingly, the presently disclosed inventive detectors, and methods of making the same, are characterized by inclusion of pulse-annealing surfaces of a detector, preferably ion-implanted surfaces to generate junctions within the detector structure.

In various embodiments, pulse-annealing may employ an optical source, e.g. using optical energy sources such as flash lamps, light emitting diodes (LEDs), lasers, or other suitable high intensity optical sources capable of emitting photons with energies at or above a band gap of the material(s) to be annealed. In one particular embodiment, a laser was employed to anneal B and/or N dopants, incorporated into a CZT detector via implantation at a concentration in a range from approximately $1 \times 10^{16}$-$1 \times 10^{19}$ atoms/cm$^3$. The experimental results in FIG. 5 revealed that the laser effectively activated the B and N dopant at energies in a range from approximately 16 mJ/cm$^2$ to approximately 24 mJ/cm$^2$. It should be noted that the energy delivered by the optical source should be carefully tuned to avoid structural damage to the detector. For instance, as in FIGS. 7A-7B, laser energies of approximately 75 mJ/cm$^2$ or above were observed to cause exemplary CZT detector structures to crack when pulsed at 10 Hz with a 15 ns pulse width.

In more embodiments, pulse-annealing may employ chemical sources, such as by leveraging intermetallic or thermitic reaction schemes. In embodiments where a chemical energy source is employed, preferably the reactants necessary to perform the intermetallic or thermitic reaction are incorporated into portions of the detector structure to be annealed, e.g. at least in the boundaries (i.e. near surfaces) of regions to be annealed. In preferred embodiments, reactants are present in or near adjacent surfaces of doped regions 206, 208 and more preferably throughout doped regions 206, 208. Reactants may be preferably separated from the surface of the CdZnTe by a thin film, e.g. $SiO_2$ or $Si_3N_4$, which acts as a protective and sacrificial layer such that the CdZnTe is not damaged by the chemical reaction. The thin film is chosen such that it can easily be removed by chemical or plasma etchants which do not etch the CdZnTe surface.

While some approaches recognize the use of thermal annealing (e.g. by incubating the detector at ~>300° C.) to activate dopants, the presently disclosed inventive fabrication techniques are distinct in the use of pulse-annealing, in which surface(s) of a detector are exposed to an appropriate energy source for a short duration (e.g. in a range from approximately 1 ns to approximately 100 ms) for a plurality of pulses (e.g. in a range from 1-1,000,000 pulses, in various embodiments). The pulse source is designed to deliver sufficient energy over a short time period such that the doped region is heated to the desired annealing temperature, but with a small total thermal load such that when the heat diffuses into the bulk of the CZT the average temperature is <150° C.

Accordingly, in various approaches detector structures exhibiting reduced electronic noise in accordance with the presently disclosed inventive concepts preferably include a CZT bulk detector having at least one surface with two or more electrodes (contacts) formed thereon. At least two of the two or more electrodes operate at different electric potentials, which generally results in increased dark current, but in accordance with the inventive structures disclosed herein the detector structure is characterized by a reduction of dark current by a factor of two or more relative to conventional CZT detector structures.

The reduction in the case of undoped structures is likely due to annealing of surface defects and for doped structures is due to activation of dopants, but generally is observed for structures fabricated using techniques as described herein, preferably including at least pulse-annealing of detector surfaces.

The exemplary inventive detector structure may optionally but preferably include ion-implanted and/or ion-doped surfaces or regions, which are preferably each connected to one or more of the electrodes formed on the surface of the detector. More preferably, each ion-implanted and/or ion-doped surface/region is independently coupled to one of the electrodes. In various embodiments, ion-implanted and/or ion-doped surfaces/regions may form junctions (preferably heterojunctions), semi-insulating regions, charge steering regions, and/or high-conductivity implants. In more embodiments, high-conductivity implants may include any suitable conductive material, whether ionic or otherwise.

In various embodiments, the ion-implanted CdZnTe surfaces may include one or more ionic species of one or more materials selected from: Group III, Group V, and Group VII.

Figure 8:
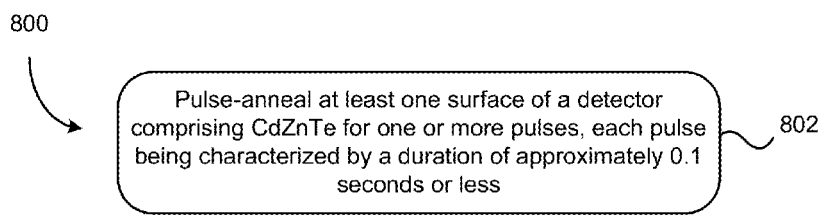
FIG. 8 is a flowchart of a method, according to one embodiment of the presently disclosed inventive concepts.

Turning now to particular methods of fabricating inventive detector structures as described herein, FIG. 8 shows a method 800 of making a detector exhibiting reduced electronic noise, in accordance with one embodiment. The method 800 as presented herein may be carried out in any desired environment that would be appreciated as suitable by a person having ordinary skill in the art upon reading the present disclosure. Moreover, more or less operations than those shown in FIG. 8 may be included in method 800, according to various embodiments. It should also be noted that any of the aforementioned features may be used in any of the embodiments described in accordance with the various methods.

As shown in FIG. 8, method 800 includes at least operation 802, where at least one surface of a detector comprising CdZnTe (CZT) is pulse-annealed for one or more pulses, each pulse being characterized by a duration of approximately 0.1 seconds or less, but may preferably include pulse durations in a range from approximately 1.0 ns to approximately 10 ms in various embodiments. More preferably, the pulse-annealing comprises a plurality of pulses, e.g. in a range of 2-1,000,000 pulses. The detector surface may be pulse-annealed with or without contacts 204a, 204b, 212 being formed/present on the surface, and/or in regions to which the contacts are coupled or regions lacking any contacts coupled thereto (again, whether or not the contacts have been formed on the surface at the time of annealing).

As noted above, and in further embodiments of method 800, the pulse-annealing may involve optical annealing, thermal annealing, or combinations thereof. Optical annealing may be performed using one or more of a flash lamp, light emitting diode, laser, or other high intensity optical source with photon energies at or above the band gap of the material.

Thermal annealing may include initiating a thermitic reaction on the at least one surface of the detector or in a thin film in close proximity to the surface(s) of the detector. Optionally, the detector may be protected or separated from the thermite material by a thin protective barrier of suitable composition and configuration, which may selected based on knowledge generally available in the art. Thermal annealing may additionally or alternatively include an exothermic intermetallic reaction, for example Ni—Al forming NiAl. As with thermitic reactions, the intermetallic reaction is preferably initiated in a film in close proximity to the CZT, either touching the surface thereof or separated therefrom by a thin protective barrier.

In accordance with another embodiment, a method 900 of forming a detector exhibiting minimal electronic noise includes operation 902, in which at least one surface of a detector comprising ion-implanted CdZnTe is pulse-annealed for one or more pulses, each pulse being characterized by a duration of approximately 0.1 seconds or less. A notable distinction between methods 800 and 900 is that method 800 requires pulse annealing surface(s) of a CZT detector, while method 900 specifies the pulse-annealed surfaces include ion-implanted CZT.

As such, a person having ordinary skill in the art will appreciate that electronic noise inherent to detectors (particularly diodes) may be reduced by pulse-annealing ion-implanted as well as non-ion-implanted surfaces of the detector. As prior work has focused exclusively on annealing ion-implanted surfaces for extended durations (e.g. 30 seconds or more), the presently disclosed inventive techniques represent a novel development and application of thermal annealing in a pulsed manner to reduce noise rather than activate implanted ions.

Figure 9:
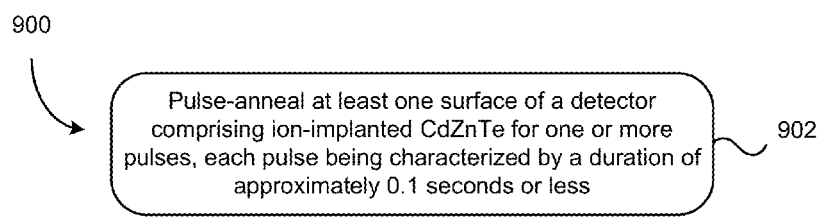
FIG. 9 is a flowchart of a method, according to one embodiment of the presently disclosed inventive concepts.

Skilled artisans will further appreciate that any of the additional or alternative features, operations, etc. set forth above with respect to FIG. 8 and method 800 are equally applicable to, and may be used in the context of, FIG. 9 and method 900, according to various embodiments.

The presently disclosed inventive techniques and structures formed thereby are characterized by minimal electronic noise, and therefore are particularly well suited for application as radiation detectors. More specifically, the inventive concepts presented herein are useful in applications such as detecting very low amounts of gamma radiation. The added sensitivity achieved using the inventive concepts described herein is a result of plasma etching, chemical oxidation, and rapid pulse-annealing surfaces of the detector structures, which enables higher operational field strength and improves detection capability.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method of forming a detector exhibiting minimal electronic noise, the method comprising:
    pulse-annealing at least one surface of a detector comprising CdZnTe (CZT) for one or more pulses, each pulse being characterized by a duration of approximately 0.1 seconds or less.

2. The method as recited in claim 1, further comprising chemically oxidating some or all portions of the at least one surface of the detector.

3. The method as recited in claim 1, wherein the pulse-annealing comprises optical annealing; and
    wherein the optical annealing is performed using at least one optical source selected from: a flash lamp, and a light emitting diode.

4. The method as recited in claim 1, further comprising plasma etching some or all portions of the at least one surface of the detector.

5. The method as recited in claim 1, wherein the pulse-annealing comprises thermal annealing using a chemical energy source.

6. The method as recited in claim 5, wherein the thermal annealing comprises initiating a thermitic reaction on the at least one surface of the detector.

7. The method as recited in claim 5, wherein the thermal annealing comprises: an exothermic intermetallic reaction.

8. The method as recited in claim 5, wherein pulse-annealing the detector reduces dark current generated by the detector by a factor of at least 2 relative to a dark current generated by the detector prior to the pulse-annealing.

9. A method of forming a detector exhibiting minimal electronic noise, the method comprising:
    pulse-annealing at least one surface of a detector comprising ion-implanted CdZnTe (CZT) for one or more pulses, each pulse being characterized by a duration of approximately 0.1 seconds or less.

10. The method as recited in claim 9, further comprising chemically oxidating some or all portions of the at least one surface of the detector.

11. The method as recited in claim 9, wherein the pulse-annealing comprises optical annealing; and
    wherein the optical annealing is performed using at least one optical source selected from: a flash lamp, and a light emitting diode.

12. The method as recited in claim 9, further comprising plasma etching some or all portions of the at least one surface of the detector.

13. The method as recited in claim 9, wherein the pulse-annealing comprises thermal annealing using a chemical energy source.

14. The method as recited in claim 13, wherein the thermal annealing comprises initiating a thermitic reaction on the at least one surface of the detector.

15. The method as recited in claim 13, wherein the thermal annealing comprises: an exothermic intermetallic reaction initiated in a film in close proximity to the CZT.

16. The method as recited in claim 13, wherein pulse-annealing the detector reduces dark current generated by the detector by a factor of at least 2 relative to a dark current generated by the detector prior to the pulse-annealing.

17. A CdZnTe (CZT) detector comprising:
    a detector surface with two or more electrodes operating at different electric potentials and coupled to the detector surface; and
    one or more ion-implanted CZT surfaces on or in the detector surface, each of the one or more ion-implanted CZT surfaces being independently connected to one of the two or more electrodes and the surface of the detector, wherein at least two of the ion-implanted surfaces are in electrical contact.

18. The detector of claim 17, wherein the two or more electrodes are arranged in a coplanar grid.

19. The detector as recited in claim 17, wherein the ion-implanted CZT surfaces comprise one or more ionic species of one or more materials selected from: Group III, Group V, and Group VII.

20. The detector as recited in claim 17, comprising a passivating layer formed on the surface of the detector in a region between the electrodes.

21. The detector as recited in claim 17, comprising one or more additional ion: implanted CZT surfaces on or in the detector surface, each of the one or more additional ion-implanted CZT surfaces being located in a region of the detector surface that is not connected to any of the two or more electrodes.

22. The detector as recited in claim 21, wherein the one or more ion-implanted CZT surfaces comprise one or more ionic species of one or more materials selected from Group VII.

* * * * *